United States Patent
Park et al.

(10) Patent No.: US 9,007,567 B2
(45) Date of Patent: Apr. 14, 2015

(54) METHOD OF ALIGNING A WAFER STAGE AND APPARATUS FOR PERFORMING THE SAME

(75) Inventors: Tae-Jin Park, Cheongju-si (KR); Cheol-Hong Kim, Yongin-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 824 days.

(21) Appl. No.: 13/221,360

(22) Filed: Aug. 30, 2011

(65) Prior Publication Data

US 2012/0092638 A1     Apr. 19, 2012

(30) Foreign Application Priority Data

Oct. 13, 2010 (KR) .................. 10-2010-0099639

(51) Int. Cl.
| | | |
|---|---|---|
| G03B 27/32 | (2006.01) | |
| G03B 27/58 | (2006.01) | |
| G03B 27/53 | (2006.01) | |
| G03F 7/20 | (2006.01) | |
| G03F 9/00 | (2006.01) | |

(52) U.S. Cl.
CPC ............ *G03B 27/58* (2013.01); *G03B 27/53* (2013.01); *G03F 7/70775* (2013.01); *G03F 9/7088* (2013.01)

(58) Field of Classification Search
CPC .... G03B 27/53; G03B 27/58; G03F 7/70775; G03F 7/70725; G03F 9/7088; G03F 9/7049; H01L 2223/54426; H01L 2223/5446; H01L 23/544
USPC .................................................. 355/77, 53, 72
See application file for complete search history.

(56) References Cited

U.S. PATENT DOCUMENTS

| | | | |
|---|---|---|---|
| 6,867,534 B2 * | 3/2005 | Tanaka | 310/328 |
| 7,349,072 B2 | 3/2008 | Beems et al. | |
| 2008/0088843 A1 * | 4/2008 | Shibazaki | 356/399 |

FOREIGN PATENT DOCUMENTS

| | | |
|---|---|---|
| KR | 20-0211355 | 1/2000 |
| KR | 2007059496 A | 6/2007 |

* cited by examiner

*Primary Examiner* — Peter B Kim
*Assistant Examiner* — Michelle Iacoletti
(74) *Attorney, Agent, or Firm* — Harness, Dickey & Pierce, P.L.C.

(57) ABSTRACT

In a method of aligning a wafer stage, the wafer stage may be moved in an X-axis direction. A first coordinate of the wafer stage may be measured from a first measurement position inclined to the X-axis. The wafer stage may be moved in a Y-axis direction. A second coordinate of the wafer stage may be measured from a second measurement position inclined to the Y-axis. Thus, a movement distance of the wafer stage may be increased, so that the interferometers may accurately measure the position of the wafer stage.

19 Claims, 5 Drawing Sheets

METHOD OF ALIGNING A WAFER STAGE AND APPARATUS FOR PERFORMING THE SAME

CROSS-RELATED APPLICATION

This application claims priority under 35 USC §119 to Korean Patent Application No. 2010-99639, filed on Oct. 13, 2010 in the Korean Intellectual Property Office (KIPO), the contents of which are herein incorporated by reference in their entirety.

BACKGROUND

1. Field

Example embodiments relate to a method of aligning a wafer stage and an apparatus for performing the same. More particularly, example embodiments relate to a method of aligning a wafer stage on which a wafer may be arranged during an exposing process, and an apparatus for performing the method.

2. Description of the Related Art

Generally, a semiconductor device may be manufactured by various processes such as a deposition process, a patterning process, an ion implantation process, etc. A desired pattern may be formed on a wafer by the patterning process.

The patterning process may include a process for forming a photoresist film on a layer, an exposing process for irradiating a light to the photoresist film through a reticle, and a developing process for developing the exposed photoresist film to form a photoresist pattern. The layer may be etched using the photoresist pattern and an etch mask to form the desired pattern on the wafer.

In order to accurately form the desired pattern, it may be required to precisely align the wafer on a wafer stage with the reticle over the wafer stage.

In a related method of aligning the wafer stage, the wafer stage may be moved to a desired position using a linear motor. The position of the wafer stage may be measured using an interferometer. The interferometer may be arranged along a driving direction of the linear motor. That is, the interferometer may be arranged parallel with the moving direction of the wafer stage. The interferometer may irradiate a light to the wafer stage. The interferometer may receive a light reflected from the wafer stage to measure the position of the wafer stage.

However, as the semiconductor device may have been highly integrated, a design rule of the semiconductor device may also become narrower. Thus, it may be required to accurately measure a position of the wafer stage.

SUMMARY

Example embodiments provide a method of accurately aligning a wafer stage.

Example embodiments also provide an apparatus for performing the above-mentioned method.

In accordance with example embodiments, there is provided a method of aligning a wafer stage. In the method of aligning the wafer stage, the wafer stage may be moved in an X-axis direction. A first coordinate of the wafer stage may be measured from a first measurement position inclined to the X-axis. The wafer stage may be moved in a Y-axis direction. A second coordinate of the wafer stage may be measured from a second measurement position inclined to the Y-axis.

In example embodiments, the first measurement position may be inclined to the X-axis at an angle of about 45°. The second measurement position may be inclined to the Y-axis at an angle of about 45°.

In example embodiments, measuring the first coordinate may include irradiating a first incident light to the wafer stage from a first interferometer on the first measurement position, and receiving a first reflected light from the wafer stage in the first interferometer. Measuring the second coordinate may include irradiating a second incident light to the wafer stage from a second interferometer on the second measurement position, and receiving a second reflected light from the wafer stage in the second interferometer.

In example embodiments, the method may further include aligning diagonal lines of the wafer stage connected between corners of the wafer stage with the X-axis and the Y-axis.

According to example embodiments, there is provided an apparatus for aligning a wafer stage. The apparatus may include a first actuator, a first measuring unit, a second actuator and a second measuring unit. The first actuator may move the wafer stage in an X-axis direction. The first measuring unit may be arranged at a first measurement position inclined to the X-axis to measure a first coordinate of the wafer stage moved by the first actuator. The second actuator may move the wafer stage in a Y-axis direction. The second measuring unit may be arranged at a second measurement position inclined to the Y-axis to measure a second coordinate of the wafer stage moved by the second actuator.

In example embodiments, the first measuring unit may be inclined to the X-axis at an angle of about 45°. The second measuring unit may be inclined to the Y-axis at an angle of about 45°.

In example embodiments, the first actuator may include a first linear motor. The first linear motor may be connected to a first corner of the wafer stage to align a first diagonal line of the wafer stage with the X-axis.

In example embodiments, the second actuator may include a second linear motor. The second linear motor may be connected to a second corner of the wafer stage to align a second diagonal line of the wafer stage with the Y-axis.

In example embodiments, the first measuring unit may include a first interferometer. The second measuring unit may include a second interferometer.

According to example embodiments, the interferometers arranged inclined to the moving directions of the wafer stage may measure the positions of the wafer stage. Thus, a movement distance of the wafer stage may be increased, so that the interferometers may accurately measure the position of the wafer stage.

In accordance with example embodiments, an apparatus for aligning a wafer stage may include a first actuator configured to move the wafer stage in a first direction, a second actuator configured to move the wafer stage in a second direction, the second direction being perpendicular to the first direction, a first measuring unit configured to irradiate first light onto the wafer stage, the direction of the irradiated first light being about 45° with respect to the first direction, and a second measuring unit configured to irradiate second light onto the wafer state, the direction of the irradiated second light being about 45° with respect to the second direction.

In example embodiments, the first and second actuators may be linear motors.

In example embodiments the first and second measuring units may be interferometers.

In example embodiments, the wafer stage may include a first mirror which is perpendicular to the first light irradiated from the first measuring unit and a second mirror which is perpendicular to the second light irradiated from the second measuring unit.

In example embodiments, the wafer stage may be substantially rectangular in shape and the first and second directions may be one of substantially parallel with and collinear with a first diagonal line extending from a first corner of the wafer stage to a second corner of the wafer stage and a second diagonal line extending from a third corner of the wafer stage to a fourth corner of the wafer stage.

In example embodiments, the first and second actuators may be attached to corners of the wafer stage.

In example embodiments, the first actuator may be configured to translate the wafer stage in the X-direction and the second actuator may be configured to translate the wafer stage in the Y-direction and the wafer stage is restrained from being rotated.

In accordance with example embodiments, an exposing apparatus is disclosed. In accordance with example embodiments the exposing apparatus may include an illuminating unit, a reticle holder below the illuminating unit, a projection lens unit below the illuminating unit, and an apparatus for aligning a wafer stage. In example embodiments, the apparatus for aligning a wafer stage may include a first actuator configured to move the wafer stage in a first direction, a second actuator configured to move the wafer stage in a second direction, the second direction being perpendicular to the first direction, a first measuring unit configured to irradiate first light onto the wafer stage, the direction of the irradiated first light being about 45° with respect to the first direction, and a second measuring unit configured to irradiate second light onto the wafer state, the direction of the irradiated second light being about 45° with respect to the second direction.

BRIEF DESCRIPTION OF THE DRAWINGS

Example embodiments will be more clearly understood from the following detailed description taken in conjunction with the accompanying drawings.

FIG. 1 is a perspective view illustrating an apparatus for aligning a wafer stage in accordance with example embodiments;

FIG. 2 is a flow chart illustrating a method of aligning a wafer stage using the apparatus in FIG. 1;

FIG. 3 is a block diagram illustrating an exposing apparatus including the aligning apparatus in FIG. 1;

FIG. 4 is a diagram illustrating a displacement of a wafer stage in accordance with a conventional art; and FIG. 5 is a diagram illustrating a displacement of a wafer stage in accordance with example embodiments.

DETAILED DESCRIPTION OF THE EMBODIMENTS

Figure 1:
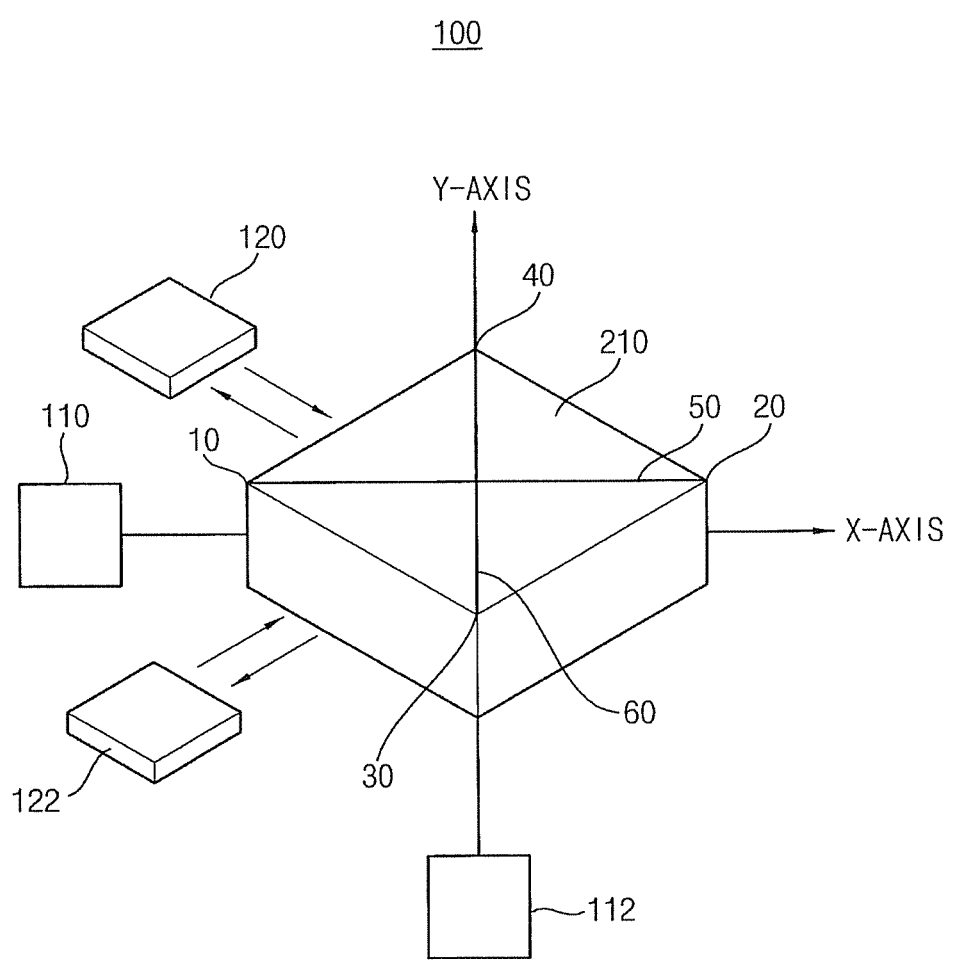
FIGS. 1 to 5 represent non-limiting, example embodiments as described herein.

Example embodiments will be described more fully hereinafter with reference to the accompanying drawings, in which example embodiments are shown. The present invention may, however, be embodied in many different forms and should not be construed as limited to the example embodiments set forth herein. Rather, example embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the term's first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

Apparatus for Aligning a Wafer Stage

FIG. 1 is a perspective view illustrating an apparatus for aligning a wafer stage in accordance with example embodiments.

Referring to FIG. 1, an apparatus 100 for aligning a wafer stage in accordance with example embodiments may include a first actuator 110, a second actuator 112, a first measuring unit 120, and a second measuring unit 122.

The first actuator 110 may be connected to the wafer stage 210 on which a wafer may be positioned. The first actuator 110 may move the wafer stage 210 in an X-axis. In example embodiments, the wafer stage 210 may have a rectangular parallelepiped shape. Reflecting mirrors 410, and 411 (see FIG. 5) may be attached on side surfaces of the wafer stage 210.

In example embodiments, the first actuator 110 may be connected to first corners of the wafer stage 210. The first corners of the wafer stage 210 may be located on the X-axis. Thus, a first diagonal line 50 connected between the first corners of the wafer stage 210 may correspond to the X-axis. For example, as shown in FIG. 1, the wafer stage 210 may have first and second corners 10 and 20. In FIG. 1, a diagonal line 50 extending from the first corner 10 to the second corner 20 may be in parallel with or coincident with the X-axis. In example embodiments, the first actuator 110 may include a linear motor.

The second actuator 112 may be connected to the wafer stage 210. The second actuator 112 may move the wafer stage 210 in a Y-axis. In example embodiments, the second actuator 112 may be connected to second corners of the wafer stage 210 located on the Y-axis. Thus, a second diagonal line connected between the second corners of the wafer stage 210 may correspond to the Y-axis. For example, as shown in FIG. 1, the wafer stage 210 may have third and fourth corners 30 and 40. In example embodiments, a diagonal line 60 may extend from the third corner 30 to the fourth corner 40 and the diagonal line 60 may be in parallel with or coincident with the Y-axis. In example embodiments, the second actuator 112 may include a linear motor.

The first measuring unit 120 may measure a first coordinate of the wafer stage 210 moved by the first actuator 110 along the X-axis. In example embodiments, the first measuring unit 120 may include a first interferometer. The first interferometer may irradiate a first incident light to the wafer stage 210 and receive a first reflected light from the wafer stage 210 to measure the first coordinate of the wafer stage 210. More specifically, the first light may be irradiated to a mirror that may be on a side of the wafer stage 210 and the mirror may reflect the first light back to the first measuring unit 120.

In example embodiments, the first measuring unit 120 may be located at a first measurement position inclined to the X-axis. That is, the first measuring unit 120 may not be located on the X-axis. The first measuring unit 120 may be inclined to the X-axis at an angle of about 45°. Because the first measuring unit 120 may be inclined to the X-axis at an angle of about 45°, the first measuring unit 120 may be oriented toward a first side surface of the wafer stage 210. That is, the first measuring unit 120 may be oriented such that the first light emitted from the first measuring unit 120 forms a 45° angle with the X-axis. Thus, the first incident light irradiated from the first measuring unit 120 may be substantially perpendicular to the first side surface of the wafer stage 210. As a result, the first reflected light may accurately head toward the first measuring unit 120.

Figure 4:
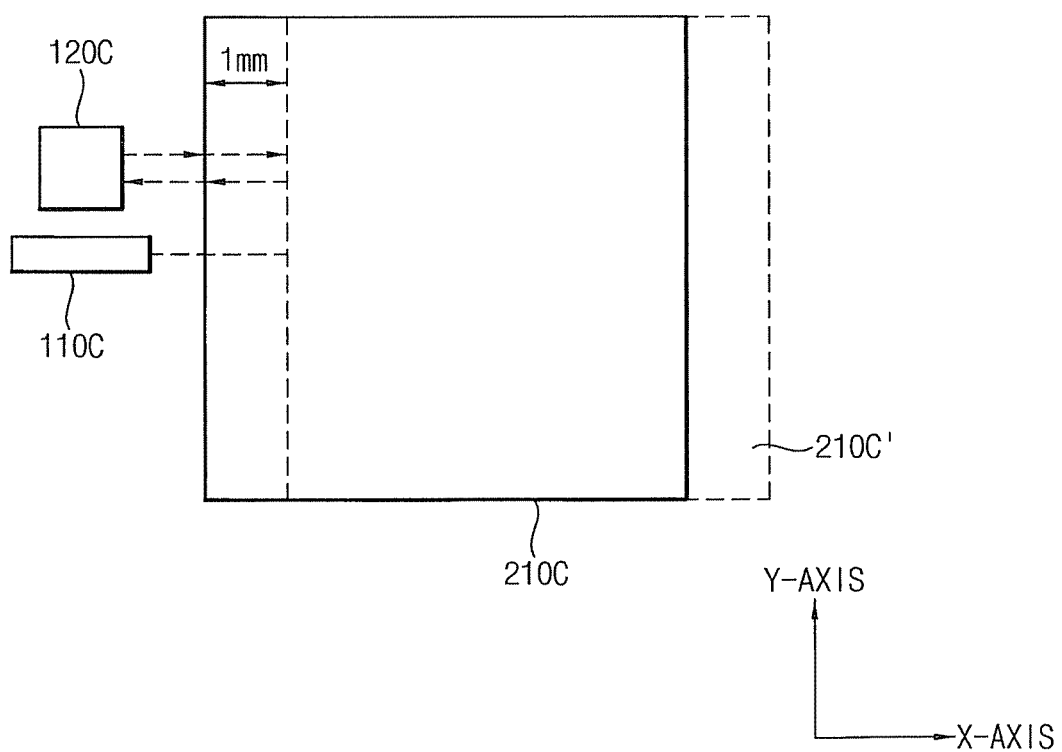
Figure 5:
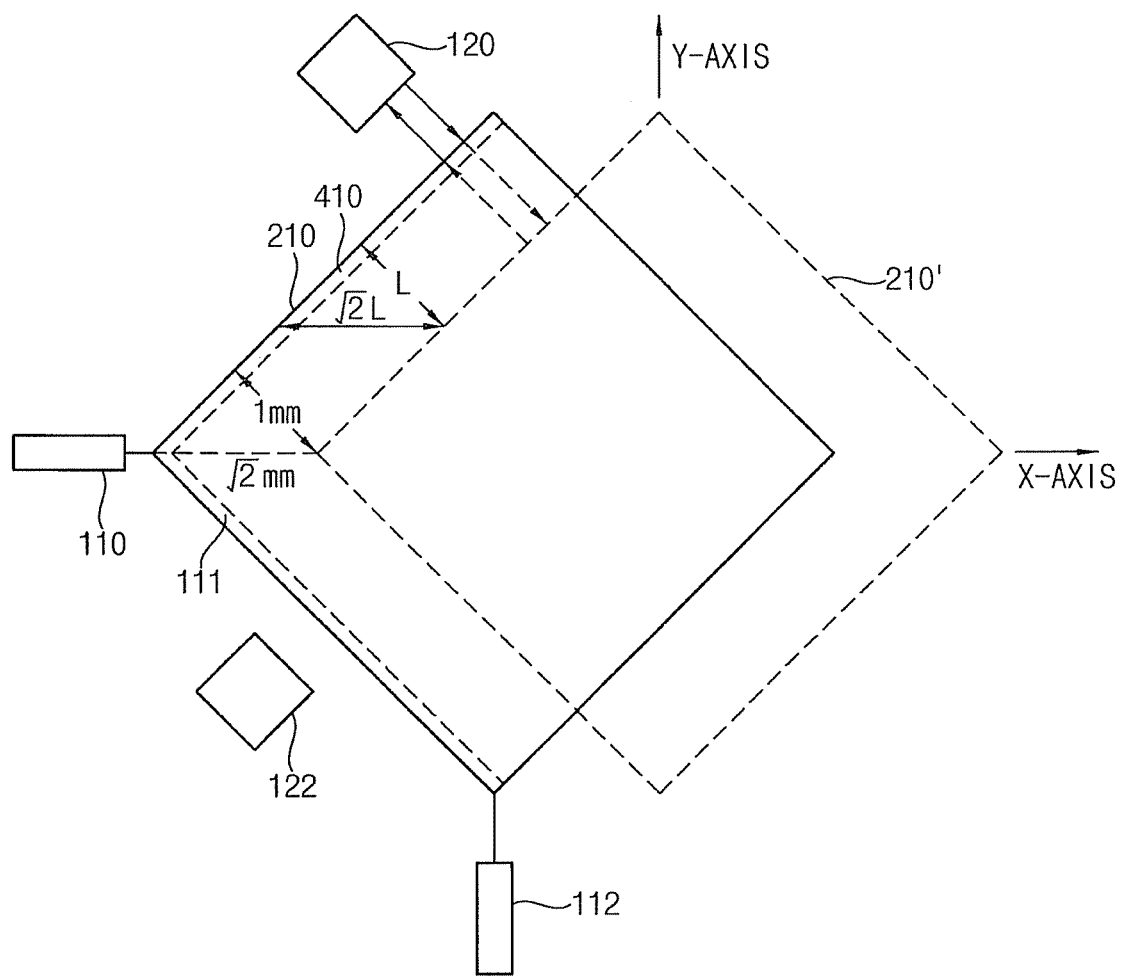

In example embodiments, a movement distance of the wafer stage 210 may be increased by arranging the first measuring unit 120 on the first measurement position inclined to the X-axis at an angle of about 45°. For example, referring to FIG. 4, when a conventional wafer stage 210C is moved by a conventional first actuator 110C along the X-axis by about 1 mm, a movement distance of the conventional wafer stage 210C along the X-axis measured by the conventional interferometer 120C on the X-axis may be about 1 mm. In FIG. 4, 210C* represents the conventional wafer stage 210C displaced by the first actuator 110C. In contrast, as shown in FIG. 5, a movement distance of the wafer stage 210 along the X-axis measured by the first measuring unit 120 on the first measurement position inclined to the X-axis at an angle of about 45° may be about square root of 2 mm even though the measured surface has only moved 1 mm in the direction light is emitted from the first measuring unit 120. In FIG. 5, 210* represents wafer stage 210 displaced by the first actuator 110. As a result, the movement distance of the wafer stage 210 along the X-axis measured by the first measuring unit 120 may be increased by (square root of 2)mm−1 mm than that measured by the conventional interferometer.

Therefore, when the movement distance of the wafer stage 210 may be increased, the first measuring unit 120 may accurately measure the movement distance of the wafer stage 210 along the X-axis. For example, in the conventional art, a first measuring unit may have an accuracy degree N. When a movement distance of a conventional wafer stage along the X-axis is L, the first measuring unit 120 may divide the movement distance L by N. However, in example embodiments, the movement distance of the wafer stage 210 measured from the first measuring unit 120 on the first measurement position inclined to the X-axis at an angle of about 45° may be the (square root of 2) of L. Thus, the first measuring unit 120 on the first measurement position inclined to the X-axis at an angle of about 45° may divide ((square root of 2)×L) by N. As a result, because a divided value of ((square root of 2)×L) by N may be higher than a divided value of L by N, the first measuring unit 120 on the first measurement position inclined to the X-axis at an angle of about 45° may accurately measure positions of the wafer stage 210 in the X-axis.

The second measuring unit 122 may measure a second coordinate of the wafer stage 210 moved by the second actuator 112 along the Y-axis. In example embodiments, the second measuring unit 122 may include a second interferometer. The second interferometer may irradiate a second incident light to the wafer stage 210 and receive a second reflected light from the wafer stage 210 to measure the second coordinate of the wafer stage 210.

In example embodiments, the second measuring unit 122 may be located at a second measurement position inclined to the Y-axis. That is, the second measuring unit 122 may not be located on the Y-axis. The second measuring unit 122 may be inclined to the Y-axis at an angle of about 45°. Because the second measuring unit 122 may be inclined to the Y-axis at an angle of about 45°, the second measuring unit 120 may be oriented toward a second side surface of the wafer stage 210 substantially perpendicular to the first side surface. Thus, the second incident light irradiated from the second measuring unit 122 may be substantially perpendicular to the second side surface of the wafer stage 210. As a result, the second reflected light may accurately head toward the second measuring unit 122.

In example embodiments, the second measuring unit 122, similar to the first measuring unit 120, may have improved accuracy degree by arranging the second measuring unit 122 on the second measurement position inclined to the Y-axis at an angle of about 45°.

Method of Aligning a Wafer Stage

Figure 2:
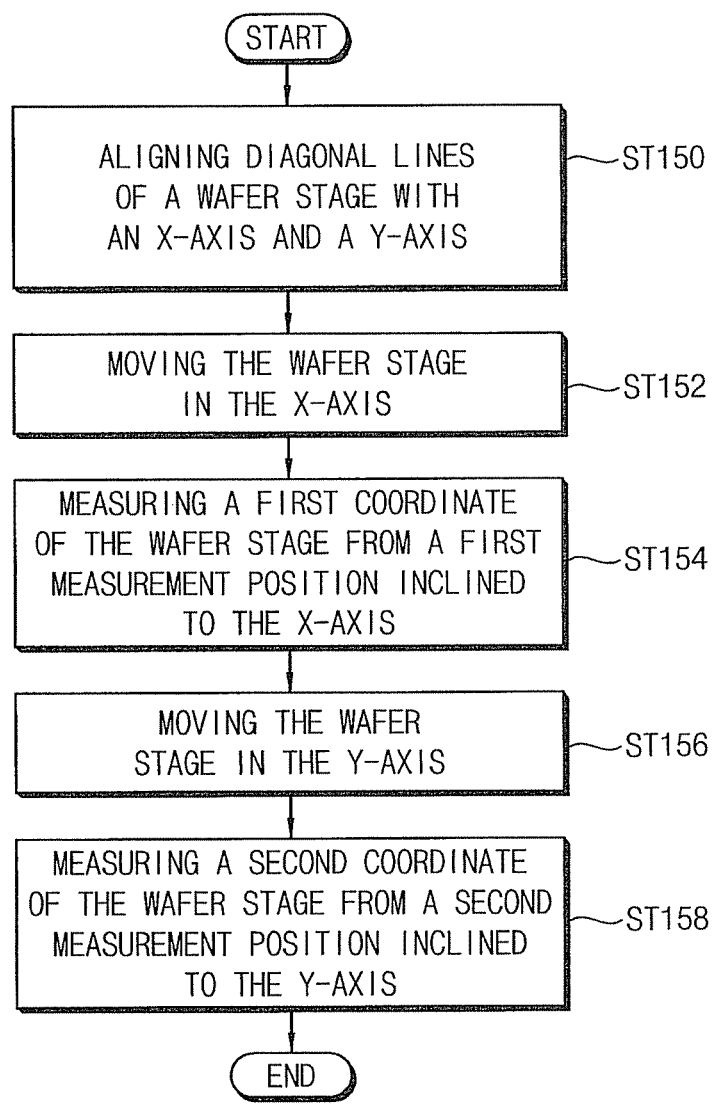

FIG. 2 is a flow chart illustrating a method of aligning a wafer stage using the apparatus in FIG. 1.

Referring to FIGS. 1 and 2, in step ST150, the wafer stage 210 may be arranged to align the first diagonal line and the second diagonal line of the wafer stage 210 with the X-axis and the Y-axis, respectively. Thus, the first side surface of the wafer stage 210 may be oriented toward the first measuring unit 120, and the second side surface of the wafer stage 210 may be oriented toward the second measuring unit 122.

In step ST152, the first actuator 110 may move the wafer stage 210 in the X-axis.

In step ST154, the first measuring unit 120 may measure a first coordinate of the wafer stage 210 moved in the X-axis. In example embodiments, the first measuring unit 120 may be arranged inclined to the X-axis at an angle of about 45° to accurately measure the first coordinate of the wafer stage 210.

In example embodiments, the first measuring unit 120 may include the first interferometer. The first interferometer may irradiate a first incident light to the first side surface of the wafer stage 210. The first interferometer may receive a first reflected light from the first side surface of the wafer stage 210 to measure the first coordinate of the wafer stage 210 on the X-axis.

In step ST156, the second actuator 112 may move the wafer stage 210 in the Y-axis.

In step ST158, the second measuring unit 122 may measure a second coordinate of the wafer stage 210 moved in the Y-axis. In example embodiments, the second measuring unit 122 may be arranged inclined to the Y-axis at an angle of about 45° to accurately measure the second coordinate of the wafer stage 210.

In example embodiments, the second measuring unit 120 may include the second interferometer. The second interferometer may irradiate a second incident light to the second side surface of the wafer stage 210. The second interferometer may receive a second reflected light from the second side surface of the wafer stage 210 to measure the second coordinate of the wafer stage 210 on the X-axis.

According to example embodiments, the interferometers arranged inclined to the movement directions of the wafer stage may measure the positions of the wafer stage. Thus, the movement distances of the wafer stage may be relatively increased, so that the interferometers may accurately measure the positions of the wafer stage.

Exposing Apparatus

Figure 3:
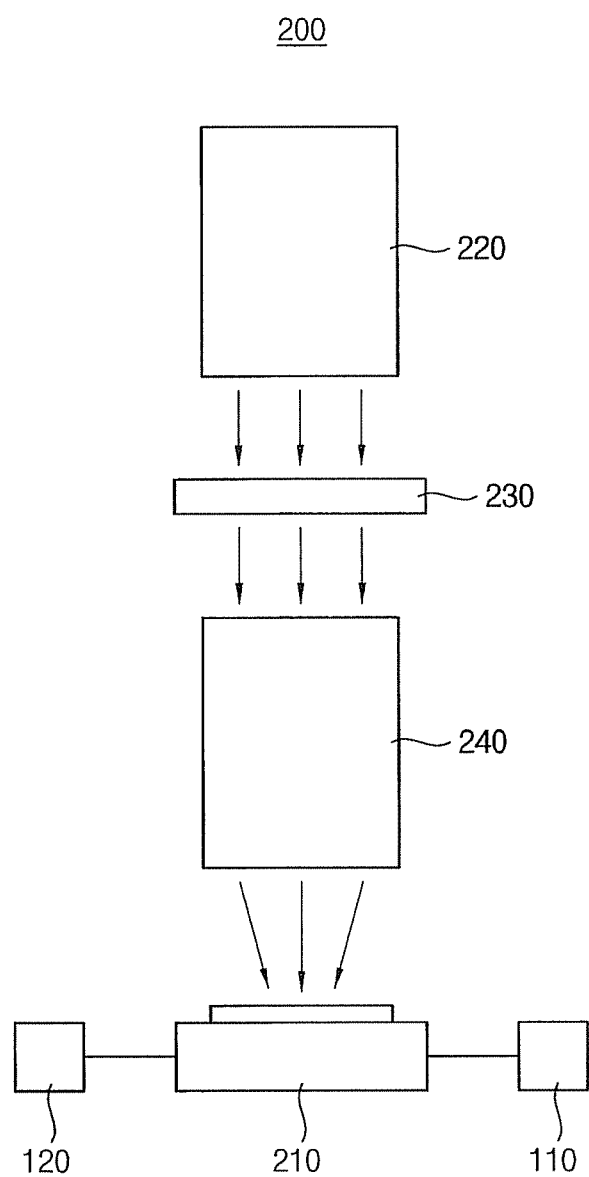

FIG. 3 is a block diagram illustrating an exposing apparatus including the aligning apparatus in FIG. 1.

Referring to FIG. 3, an exposing apparatus 200 of according to example embodiments may include the wafer stage 210, an illuminating unit 220, a reticle holder 230, a projection lens unit 240 and an aligning unit 100.

In example embodiments, the aligning unit 100 may include elements substantially the same as those of the apparatus in FIG. 1. Thus, the same reference numerals may refer to the same elements, and any further illustrations with respect to the same elements may be omitted herein for brevity.

The illuminating unit 220 may be arranged over the wafer stage 210. The illuminating unit 220 may irradiate a light to a wafer on the wafer stage 210.

The reticle holder 230 may be interposed between the illuminating unit 220 and the wafer stage 210. The reticle holder 230 may hold a reticle.

The projection lens unit 240 may be interposed between the reticle holder 230 and the wafer stage 210. The projection lens unit 240 may reduce the light through the reticle.

According to example embodiments, because the aligning unit may have improved accuracy degree, the aligning unit may accurately measure positions of the wafer stage. Thus, overlay accuracy between the wafer stage and the reticle holder may be improved. As a result, a desired pattern may be accurately formed using the exposing apparatus.

According to example embodiments, the interferometers arranged inclined to the moving directions of the wafer stage may measure the positions of the wafer stage. Thus, a movement distance of the wafer stage may be increased, so that the interferometers may accurately measure the position of the wafer stage.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of aligning a wafer stage, the method comprising:

moving the wafer stage in an X-axis direction;

measuring a first coordinate of the wafer stage by measuring a first light irradiated from a first measurement position and reflected by the wafer stage, a path of the first light being inclined with respect to the X-axis;

moving the wafer stage in a Y-axis direction; and measuring a second coordinate of the wafer stage by measuring a second light irradiated from a second measurement position and reflected by the wafer stage, a path of the second light being inclined to the Y-axis; and aligning diagonal lines of the wafer stage connected between corners of the wafer stage with the X-axis and the Y-axis.

2. The method of claim 1, wherein the path of the first light is inclined with respect to the X-axis at an angle of about 45°, and the path of the second light is inclined with respect to the Y-axis at an angle of about 45°.

3. The method of claim 1, wherein the measuring a first coordinate comprises:

irradiating the first light to the wafer stage from a first interferometer on the first measurement position; and receiving the first light reflected from the wafer stage in the first interferometer.

4. The method of claim 1, wherein the measuring a second coordinate comprises:
   irradiating the second light to the wafer stage from a second interferometer on the second measurement position; and
   receiving the second light reflected from the wafer stage in the second interferometer.

5. The method of claim 1, wherein the wafer stage having a rectangular parallelepiped shape.

6. The method of claim 1, wherein the X-axis being in parallel with or coincident a first diagonal line connecting a first pair of opposing corners of the wafer stage.

7. The method of claim 1, wherein the X-axis, the Y-axis, a path of the first light, the path of the second light are on a same plane.

8. An apparatus for aligning a wafer stage, the apparatus comprising:
   a first actuator configured to move the wafer stage in an X-axis direction, the first actuator including a first linear motor connected to a first corner of the wafer stage to align a first diagonal line of the wafer stage with the X-axis;
   a first measuring unit arranged on a first measurement position, the first measuring unit configured to measure a first coordinate of the wafer stage by measuring a first light irradiated from the first measurement position and reflected by the wafer stage, a path of the first light being inclined with respect to the X-axis;
   a second actuator configured to move the wafer stage in a Y-axis direction; and
   a second measuring unit arranged on a second measurement position, the second measuring unit configured to measure a second coordinate of the wafer stage by measuring a second light irradiated from the second measurement position and reflected by the wafer stage, a path of the second light being inclined with respect to the Y-axis.

9. The apparatus of claim 8, wherein the first measuring unit is arranged such that the path for the first light is inclined with respect to the X-axis at an angle of about 45°, and the second measuring unit is arranged such that the path for the second light is inclined with respect to the Y-axis at an angle of about 45°.

10. The apparatus of claim 8, wherein the second actuator comprises a second linear motor.

11. The apparatus of claim 10, wherein the second linear motor is connected to a second corner of the wafer stage to align a second diagonal line of the wafer stage with the Y-axis.

12. The apparatus of claim 8, wherein the first measuring unit comprises a first interferometer.

13. The apparatus of claim 8, wherein the second measuring unit comprises a second interferometer.

14. An apparatus for aligning a wafer. stage, the apparatus comprising:
   a first actuator configured to move the wafer stage in a first direction;
   a second actuator configured to move the wafer stage in a second direction, the second direction being perpendicular to the first direction;
   a first measuring unit configured to irradiate first light to a first side surface of the wafer stage, a path of the irradiated first light being about 45° with respect to the first direction; and
   a second measuring unit configured to irradiate second light to a second side surface of the wafer state, a path of the irradiated second light being about 45° with respect to the second direction,
   wherein the wafer stage includes a first mirror and a second mirror, the first mirror is perpendicular to the first light irradiated from the first measuring unit, and a second mirror is perpendicular to the second light irradiated from the second measuring unit.

15. The apparatus of claim 14, wherein the first and second actuators are linear motors.

16. The apparatus of claim 14, wherein the first and second measuring units are interferometers.

17. The apparatus of claim 14, wherein the wafer stage is substantially rectangular in shape and the first and second directions are substantially parallel with and collinear with a first diagonal line extending from a first corner of the wafer stage to a second corner of the wafer stage and a second diagonal line extending from a third corner of the wafer stage to a fourth corner of the wafer stage, respectively.

18. The apparatus of claim 17, wherein the first and second actuators are attached to corners of the wafer stage.

19. An exposing apparatus comprising,
   an illuminating unit;
   a reticle holder below the illuminating unit;
   a projection lens unit below the illuminating unit; and
   the apparatus of claim 14 below the projection lens unit.

* * * * *